(12) United States Patent
Gasperi et al.

(10) Patent No.: US 7,526,392 B2
(45) Date of Patent: *Apr. 28, 2009

(54) POWER LINE PARAMETER ANALYSIS METHOD AND SYSTEM

(75) Inventors: Michael L. Gasperi, Racine, WI (US); David L. Jensen, Barneveld, WI (US); David T. Rollay, Franklin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/094,389

(22) Filed: Mar. 30, 2005

(65) Prior Publication Data

US 2006/0229831 A1 Oct. 12, 2006

(51) Int. Cl.
G01R 21/00 (2006.01)

(52) U.S. Cl. .............. 702/60; 702/59; 702/62; 702/65; 324/521; 600/547

(58) Field of Classification Search .............. 702/59, 702/60, 62, 65; 324/691, 707, 539, 544, 324/543; 331/107, 185; 600/547; 333/33, 333/26, 115, 116, 117
See application file for complete search history.

(56) References Cited

U.S. PATENT DOCUMENTS

| | | | | |
|---|---|---|---|---|
| 2,875,536 A * | 3/1959 | Sherbondy | 38/12 |
| 4,780,661 A * | 10/1988 | Bolomey et al. | 324/638 |
| 4,870,341 A * | 9/1989 | Pihl et al. | 324/600 |
| 5,150,064 A * | 9/1992 | Nozick | 324/691 |
| 5,264,154 A * | 11/1993 | Akiyama et al. | 252/301.4 F |
| 5,359,711 A * | 10/1994 | Hartmann et al. | 715/503 |
| 5,587,662 A | 12/1996 | Kelley et al. | |
| 5,631,569 A | 5/1997 | Moore et al. | |
| 5,818,245 A * | 10/1998 | Allfather | 324/707 |
| 6,011,446 A * | 1/2000 | Woods | 331/185 |
| 6,081,123 A * | 6/2000 | Kasbarian et al. | 324/521 |
| 6,128,169 A * | 10/2000 | Neiger et al. | 361/42 |
| 6,438,505 B1 * | 8/2002 | Pouvreau | 702/145 |
| 6,515,485 B1 | 2/2003 | Bullock et al. | |
| 6,825,649 B2 * | 11/2004 | Nakano | 324/126 |
| 6,887,339 B1 * | 5/2005 | Goodman et al. | 156/345.28 |
| 7,164,275 B2 | 1/2007 | Gasperi | |
| 2003/0016001 A1 * | 1/2003 | Borup | 323/364 |
| 2003/0080824 A1 * | 5/2003 | Tanaka et al. | 333/33 |
| 2003/0142036 A1 * | 7/2003 | Wilhelm et al. | 343/909 |
| 2005/0109386 A1 * | 5/2005 | Marshall | 136/253 |

(Continued)

OTHER PUBLICATIONS

Operator's Manual ZM-100 Mains Impedance Meter; Precision Control Systems; Sold and Marketed by Powerlines; 41 pages.

(Continued)

*Primary Examiner*—Carol S Tsai
(74) *Attorney, Agent, or Firm*—Fletcher Yoder Law; Alexander R. Kuszewski

(57) ABSTRACT

A method and apparatus is disclosed for determining the incident energy of a system. Specifically, there is provided a technique comprising measuring a voltage of an ac waveform, causing a resonant ring in the ac waveform, measuring a frequency of the resonant ring, computing a line impedance based upon the measured voltage and the frequency of the resonant ring, and computing a bolted fault current based on the line impedance and the measured voltage.

15 Claims, 11 Drawing Sheets

U.S. PATENT DOCUMENTS

| | | | |
|---|---|---|---|
| 2005/0215918 A1* | 9/2005 | Frantz et al. | 600/547 |
| 2006/0069593 A1* | 3/2006 | Estefania et al. | 705/7 |
| 2006/0114630 A1* | 6/2006 | Culligan et al. | 361/62 |
| 2006/0241881 A1 | 10/2006 | Gasperi | |

OTHER PUBLICATIONS

Z-Brick features and specifications; Z-Brick, the newly introduced line-to-line impedance test otion for the EPA 2000; http://www.rxms.com/zbrick.htm; 2 pages.

Stephen B. Dubina, Jr. and Thomas D. Barkand; AC System Impedance Testing; Mine Safety and Health Administration Mine Electrical Systems Division; 8 pages.

SureTest Circuit Analyzer and SureTest w/AFCI.Instructions; #61-154, #61-155, Ideal Industries, Inc.; 10 pages.

Adly A. Girgis and R. Brent McManis; Frequency Domain Techniques For Modeling Distribution or Transmission Networks Using Capacitor Switching Induced Transients, IEEE Transactions on Power Delivery, vol. 4, No. 3, Jul. 1989; 9 pages.

Keiju Matsui, Nobuyuki Ishigure, and Fukashi Ueda; On-line Impedance Meter to Measure the Impedance of a Distribution Line Using Inverter; IECON'01: The 27th Annual Conference of the IEEE Industrial Electronics Society; 2001; 7 pages.

Baldwin, Thomas L., et al., Using A Microprocessor-Based Instrument to Predict the Incident Energy From Arc-Flash Hazards, IEEE Transactions on Industry Applications, vol. 40, No. 3, May/Jun. 2004, pp. 877-886.

Hill, Dennis J., et al., Designing, Operating, and Maintenance Strategies to Limit ARC Flash Energy Exposure, Petroleum and Chemical Industry Technical Conference, Fifty-First Annual Conference 2004, San Francisco, California, USA, IEEE 2004, US, Piscataway, NJ, USA, IEEE, US, Sep. 13, 2004, pp. 339-349.

Hodder M., et al., A Practical Approach to Arc Flash Hazard Analysis and Reduction, Pulp and Paper Industry Technical Conference, 2004; Conference Record of the 2004 Annual Victoria, BC, Canada, Jun. 27-Jul. 1, 2004, Piscataway, NJ, USA, IEEE, Jun. 27, 2004, pp. 111-119.

* cited by examiner

POWER LINE PARAMETER ANALYSIS METHOD AND SYSTEM

BACKGROUND

The present technique relates generally to the field of electrical distribution. Specifically, the invention relates to techniques for determining the impedance parameters of electrical power, for determining incident energy, for determining a flash protection boundary, and for determining a level of personal protective equipment ("PPE") that may be required or advisable based upon the available energy and similar considerations.

Systems that distribute electrical power for residential, commercial, and industrial uses can be complex and widely divergent in design and operation. Electrical power generated at a power plant may be processed and distributed via substations, transformers, power lines, and so forth, prior to receipt by the end user. The end user may receive the power over a wide range of voltages, depending on availability, intended use, and other factors. In large commercial and industrial operations, the power may be supplied as three phase ac power (e.g., 208 to 690 volt ac, and higher). Power distribution and control equipment then conditions the power and applies it to loads, such as electric motors and other equipment. In one exemplary approach, collective assemblies of protective devices, control devices, switchgear, controllers, and so forth are located in enclosures, sometimes referred to as "motor control centers" or "MCCs". Though the present techniques are discussed in the context of MCCs, the techniques may apply to power management systems in general, such as switchboards, switchgear, panelboards, pull boxes, junction boxes, cabinets, other electrical enclosures, and distribution components.

A typical MCC may manage both application of electrical power, as well as data communication, to the loads, such loads typically including various machines or motors. A variety of components or devices used in the operation and control of the loads may be disposed within the MCC. Exemplary devices contained within the MCC are motor starters, overload relays, circuit breakers, and solid-state motor control devices, such as variable frequency drives, programmable logic controllers, and so forth. The MCC may also include relay panels, panel boards, feeder-tap elements, and the like. Some or all of the devices may be disposed within units sometimes referred to as "buckets" that are mounted within the MCC. The MCC itself typically includes a steel enclosure built as a floor mounted assembly of one or more vertical sections containing the buckets.

The MCC normally contains power buses and wiring that supply power to the buckets and other components. For example, the MCC may house a horizontal common power bus that branches to vertical power buses within the MCC. The vertical power buses, known as bus bars, then extend the common power supply to the individual buckets. Other large power distribution equipment and enclosures typically follow a somewhat similar construction, with bus bars routing power to locations of equipment within the enclosures.

To electrically couple the buckets to the vertical bus, and to simplify installation and removal, the buckets may comprise electrical connectors or clips, known as stabs. To make the power connection, the stabs engage (i.e., clamp onto) the bus bars. For three phase power, there may be at least three stabs per bucket to accommodate the three bus bars for the incoming power. It should be noted that though three phase ac power is primarily discussed herein, the MCCs may also manage single phase or dual phase ac power, as well as dc power (e.g., 24 volt dc power for sensors, actuators, and data communication). Moreover, in alternate embodiments, the individual buckets may connect directly to the horizontal common bus by suitable wiring and connections. Similarly, in contexts other than MCCs, the structures described herein will, of course, be adapted to the system, its components, and any enclosures that house them.

A problem in the operation of MCCs and other power management systems, such as switchboards and panelboards, is the occurrence of arcing (also called an arc, arc fault, arcing fault, arc flash, arcing flash, etc.) which may be thought of as an electrical conduction or short circuit across the air between two conductors. Initiation of an arc fault may be caused by a loose connection, build-up of foreign matter such as dust or dirt, insulation failure, or a short-circuit between the two conductors (e.g., a foreign object establishing an unwanted connection between phases or from a phase to ground) which causes the arc. Once initiated, arcing faults often typically proceed in a substantially continuous manner until the power behind the arc fault is turned off. However, arcing faults can also comprise intermittent failures between phases or phase-to-ground. In either case, the result is an intense thermal event (e.g., temperatures up to 35,000° F.) causing melting or vaporization of conductors, insulation, and neighboring materials.

The energy released during an arcing fault is known as incident energy. Incident energy is measured in energy per unit area, typically Joules per square centimeter ($J/cm^2$). Arcing faults can cause damage to equipment and facilities and drive up costs due to lost production. More importantly, the intense heat generated by arcing faults has led to the establishment of standards for personal protective equipment ("PPE") worn by service personnel when servicing electrical equipment.

There are five levels of PPE numbered from 0 to 4. Whereas, level 0 PPE comprises merely a long sleeved shirt, long pants, and eye protection, level 4 PPE comprises a shirt, pants, a flame retardant overshirt and overpants, a flash suit, a hard hat, eye protection, flash suit hood, hearing protection, leather gloves, and leather work shoes. PPE levels 1-3 comprise increasing amounts of protective clothing and equipment in increasing greater amounts between levels 0 and 4. As such, the higher the PPE level, the more protective clothing or equipment a person will put on (referred to as "donning") or take off (known as "doffing") before servicing the equipment. Accordingly, the time to donn and doff the protective equipment increases as the PPE level increases. For example whereas it may take less than a minute to donn or doff level 1 PPE, it may take 20 minutes or more to donn or doff level 4 PPE. These donning and doffing times can directly affect productivity. As such, it is advantageous to accurately determine the potential incident energy of a potential arc flash so that the appropriate level of PPE.

Many other uses and applications exist for information relating to incident energy, and other power line electrical parameters. These include, but are not limited to, the sizing and design of filters, the commissioning and design of motor drives and other equipment, the monitoring of power lines and components for degradation and failure, and so forth.

Conventional methods for determining power line parameters and PPE levels rely on approximation techniques or require complex, extensive modeling of electrical equipment. There is a need in the art for improved techniques for determining the incident energy. There is a particular need for a technique that would permit the accurate determination and communication of incident energy, the determination of flash protection boundaries, and the determination and communication of PPE levels that correspond to a particular incident energy.

BRIEF DESCRIPTION

The present invention provides novel techniques for determining the incident energy of a potential arc flash in an electrical device, for determining a flash protection boundary, for determining a PPE level, and for communicating such determinations to users and service personnel. The techniques can be used on single-phase and three-phase applications with little modification. Moreover, the technique can be implemented in permanent (i.e., hard-wired) circuitry, or can be part of portable or even hand-held devices used to determine the incident energy on a periodic or sporadic basis. Still further, the technique may be implemented in a stand-alone embodiment or in a distributed network.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
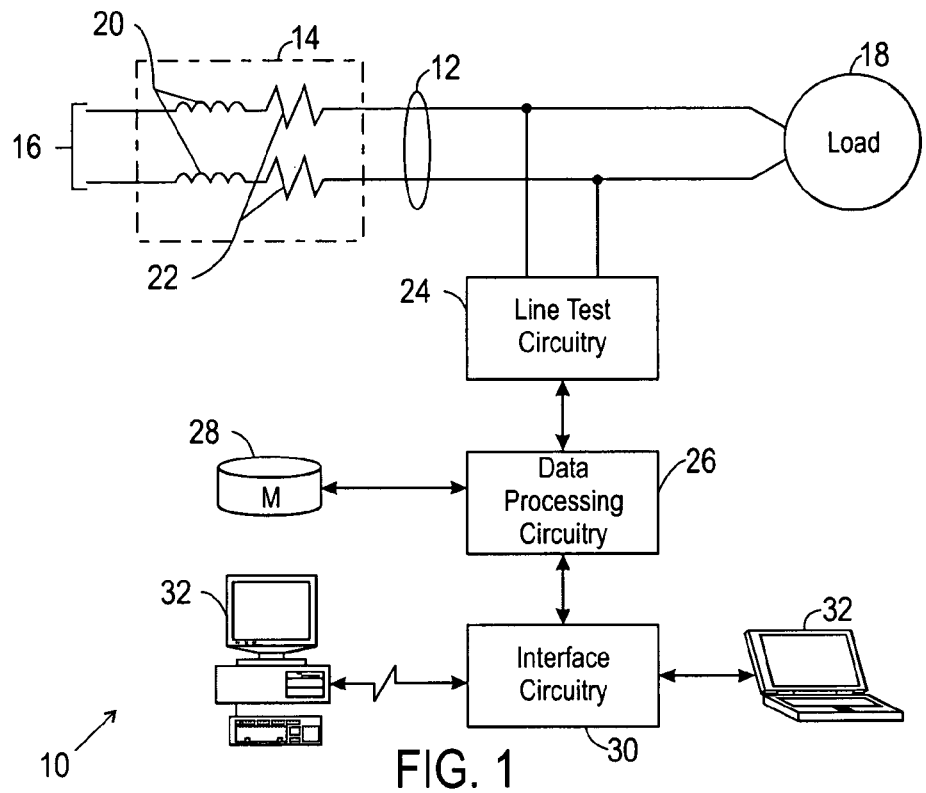
FIG. 1 is a diagrammatical representation of a power line impedance measurement system in accordance with aspects of the present technique, applied to a single-phase application.

Turning now to the drawings, and referring first to FIG. 1, an impedance monitoring system is illustrated and designated generally by the reference numeral 10. The impedance monitoring system is illustrated in a single-phase application. That is, the system is illustrated for identifying the impedance of a single-phase power source. As will be appreciated by those skilled in the art, and as discussed in greater detail below, the system may be easily adapted for identifying impedance parameters of three-phase power lines and sources as well.

Impedance monitoring system 10 is illustrated as coupled to a pair of power supply lines 12. Power supply lines 12, and any upstream circuitry, such as transformers, connectors, and so forth are considered to have a net impedance illustrated by equivalent circuitry in box 14 of FIG. 1. The impedance 14 is, for the present purposes, considered to be a collective or cumulative impedance of the entire power supply network, represented generally by reference numeral 16 to a point between a power supply grid and a load 18. As discussed in greater detail below, the present system provides the potential for determining impedance by measurement at or adjacent to a load 18. In practical applications, the monitoring system 10 may be coupled at any point along the power supply lines.

Impedance 14 is generally considered to include inductive components 20 and resistor components 22. The inductive and resistive components will be present in both supply lines, although for the present purposes these components may be grouped or accumulated into a net inductive component and a net resistive component as discussed in greater detail below.

System 10 includes line test circuitry 24 for perturbing the voltage waveform transmitted through the power lines and for making measurements of the voltage waveform. The line test circuitry 24 is coupled to and works in conjunction with data processing circuitry 26. As discussed in greater detail below, the line test circuitry 24 and the data processing circuitry 26 may, in certain applications, be analog circuitry, or at least partially comprise analog circuitry. In a present embodiment, however, the line test circuitry and the data processing circuitry digitally sample voltage measurements and store the sampled data in a memory 28. The stored sampled voltage measurements are then analyzed to determine parameters of the voltage waveform that are used to compute the values of inductive and resistive components of the line impedance. As will be apparent to those skilled in the art, the data processing circuitry 26 and memory 28 may be any suitable form. For example, both of these components may be included in a general purpose or application-specific computer. Moreover, the circuitry may be local and permanently installed with an application, or may be portable circuitry, such as in hand-held devices. Similarly, the data processing circuitry and memory may be entirely remote from the line test circuitry so as to provide the desired analysis without necessarily displacing equipment or operators to the test site.

The data processing circuitry 26 may be accessed and interfaced with operator workstations by interface circuitry 30. The interface circuitry 30 may include any suitable interfaces, such as Ethernet cards and interfaces, Internet access hardware and software, or other network interfaces. In appropriate situations, the interface circuitry 30 may allow for interfacing with the data processing circuitry by conventional serial port communication, and so forth. As illustrated in FIG. 1, various operator interfaces may be envisioned, including laptop computers, computer workstations, and so forth, as represented generally by reference numeral 32 in FIG. 1.

Figure 2:
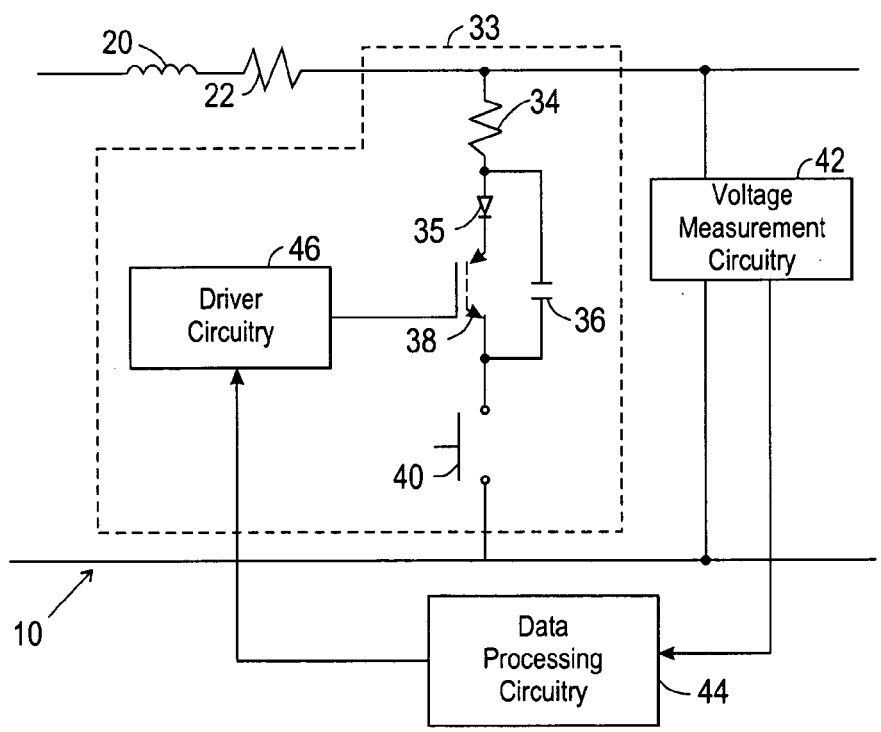
FIG. 2 is a somewhat more detailed view of certain of the circuitry of the power line impedance measurement system of FIG. 1.

The line test circuitry 24 is illustrated in somewhat greater detail in FIG. 2, along with the physical relationship between the portions of the circuitry. As noted above, the collective or cumulative impedance in the power lines may be diagrammatically represented as a single inductive component 20 and a resistive component 22. The line test circuitry 24 includes voltage perturbation circuitry 33. The voltage perturbation circuitry 33 includes a resistor 34 which is coupled in series with a capacitor 36. A diode 35 and a solid state switch 38 are coupled in parallel with the capacitor 36 so as to permit the capacitor 36 to be bypassed by creating a short circuit between the power lines during a test sequence as summarized below. Those skilled in the art will appreciate that the diode 35 may be omitted in direct current embodiments. Where desired, an enable switch, represented generally at reference numeral 40, may be provided in series with these components. A switch 40 may permit an operator to enable a test sequence, while removing the components from the power line circuit during normal operation. Thus, switch 40 may permit any leakage current between the power lines to be avoided.

Voltage measurement circuitry 42 is provided that spans the power line conductors. The voltage measurement circuitry 42 may include any suitable voltage measurement configurations, and is particularly adapted to sample voltage across the power lines and to provide values representative of the sampled voltage to data processing circuitry 44. The data processing circuitry 44 includes the data processing circuitry 26 and the memory 28 illustrated in FIG. 1, along with any appropriate programming for carrying out the functions, measurements, and analyses described below. To initiate and advance the test sequences for measuring the parameters of the power line impedance, the data processing circuitry 44 is coupled to driver circuitry 46 which provides signals to solid switch state 38 to open and close the switch as described in greater detail below.

Although the present invention is not intended to be limited to any particular circuit configuration or component values, the following component values have been found effective in identifying impedance parameters in a 60 Hz power source. Resistor 34 was implemented as a 1Ω resistor, while the value of capacitor 36 was 22 μF. The switch 38 was selected as an insulated gate bipolar transistor (IGBT) having a voltage rating of 1200V and amperage rating of 400 A. It is advisable that the switch 38 be overrated to some degree to permit peaks in the voltage waveform that may result from opening and closing of the switch, and particularly the affects of the resonant ring following closure.

Figure 3:
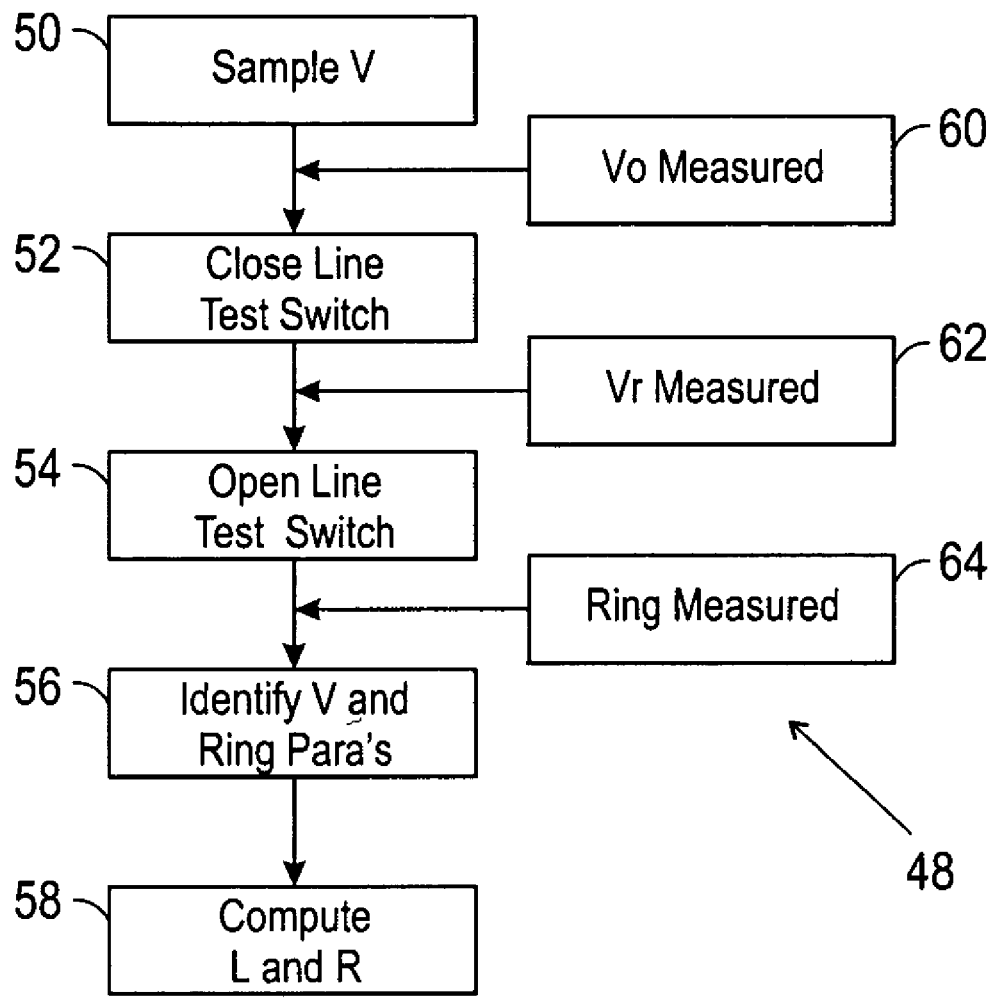
FIG. 3 is a diagrammatical representation of certain exemplary steps in identifying power line impedance values based upon the circuitry of FIGS. 1 and 2.

Exemplary logic 48 for a particular test sequence implemented by the circuitry of FIG. 2 is illustrated diagrammatically in FIG. 3. As noted above, voltage test circuitry 42 first begins to sample voltage across the power lines as indicated at reference numeral 50. At a desired point in the waveform, the switch 38 is closed, as indicated at step 52 in FIG. 3. Closure of switch 38 (with switch 40 closed to enable the circuitry, where such a switch is provided) causes a short circuit between the power lines, by routing current around capacitor 36. The low value of the resistor 34 acts as a drain or burden, causing a droop in the voltage waveform peak as described in greater detail below. Subsequently, switch 38 is opened, as indicated at reference numeral 54. Opening of the switch then causes a resonant ring between the inductive component 20 of the line impedance and the capacitor 36. This resonant ring is dampened by the resistive component 22 of the power line impedance and by the resistor 34.

With the voltage continuously being measured (i.e., sampled) by the voltage measurement circuitry 42, measurements are stored in the memory circuitry for later analysis. In a present implementation, with digital sampling of the voltage waveform, at step 56 in FIG. 3, the voltage and ring parameters used to identify the inductive and resistive components of the line impedance are then determined. At step 58 the inductive and resistive components of the line impedance are then computed based upon these identified values.

Thus, with steps 50 through 58 being carried out, the system response is measured continuously through the sampled data. These measurements are summarized at step 60 in FIG. 3, where a value of the voltage with the line test circuitry open is measured, and step 62 where a voltage across the power lines with the resistor 34 in short circuit between the power lines is measured. Step 64 represents measurement of the ring parameters used in the subsequent computations.

The calculations made of the inductive and resistive components of the power line impedance in accordance with the present techniques may be based upon the following computational scheme. As will be appreciated by those skilled in the art, the inductive-capacitive (LC) resonant frequency established upon opening of switch 38, with little or no damping in the circuit may be expressed by the relationship:

$$2\pi f = \frac{1}{\sqrt{L\, Cload}} \qquad \text{Equation 1}$$

where f is the resonant frequency of the LC circuit, L is the value of the inductive component of the line impedance, and the parameter Cload is the value of the capacitor 36 discussed above.

It will be noted, however, the resistor 34, particularly where a very low value of resistance is chosen, will provide significant damping to the resonant ring. Indeed, as will be appreciated by those skilled in the art, the value of the resistor 34 chosen strikes a balance between the desire to adequately sample a voltage droop caused by the drain represented by the resistor, while providing a significantly long (i.e., less damped) resonant ring to permit measurement of the ring period or frequency. Considering such damping, the relationship indicated in Equation 1 becomes described by the following relationship:

$$2\pi f = \sqrt{\frac{1}{L\, Cload} - \left(\frac{R + Rload}{2L}\right)^2} \qquad \text{Equation 2}$$

where the value R represents the value of the resistive component of the line impedance, and the value Rload represents the rating of the resistor 34 discussed above.

Based upon equation 2, and solving for the value of the line inductance L, the following relationship may be expressed in terms only of the values of Cload, Rload and the frequency f:

$$L = \frac{\frac{1}{Cload} + \sqrt{\frac{1}{Cload^2} - (2\pi f)^2 Rload^2}}{2(2\pi f)^2} \quad \text{Equation 3}$$

To complete the system of equations desired for calculating the inductive and resistive components of the line impedance, in accordance with the present techniques, the voltage sag or droop caused by closure of switch 38 and the presence of the drain or burden resistor 34 may be expressed in terms of the voltage sampled across the power lines with the line test circuitry open, indicated by the quantity Vo, and the voltage across the power lines with the circuitry closed, Vr, that is, with the resistor 34 in a series across the power lines as follows:

$$Vr = Vo \frac{Rload}{j377L + R + Rload} \quad \text{Equation 4}$$

where Vo and Vr are either the peak or RMS ac voltage values. It should be noted that the value 377 in Equation 4 (and in the subsequent equations below) is derived from the product of $2\pi$ and a line frequency of 60 Hz. As will be appreciated by those skilled in the art, the equations will differ for other line frequencies, although the principles for computation of the line impedance parameters will remain unchanged. Equation 4 may be rewritten as follows:

$$Vr = Vo \frac{Rload}{\sqrt{(377L)^2 + (R + Rload)^2}} \quad \text{Equation 5}$$

It may be noted that Equation 5 may be solved in terms of the value of the resistive component of the line impedance, R, as follows:

$$R = \sqrt{\frac{(Vo\ Rload)^2 - (Vr\ 377\ L)^2}{Vr^2}} - Rload \quad \text{Equation 6}$$

Thus, based upon three measured values alone, the values of the inductive component of the line impedance, L, and the resistive component of the power line impedance, R, may be computed by Equations 3 and 6. The measured values, in accordance with the present technique, are the values of Vo, Vr, and the frequency f, or the period, which will be appreciated by those skilled in the art, is the inverse of this frequency value.

Figure 4:
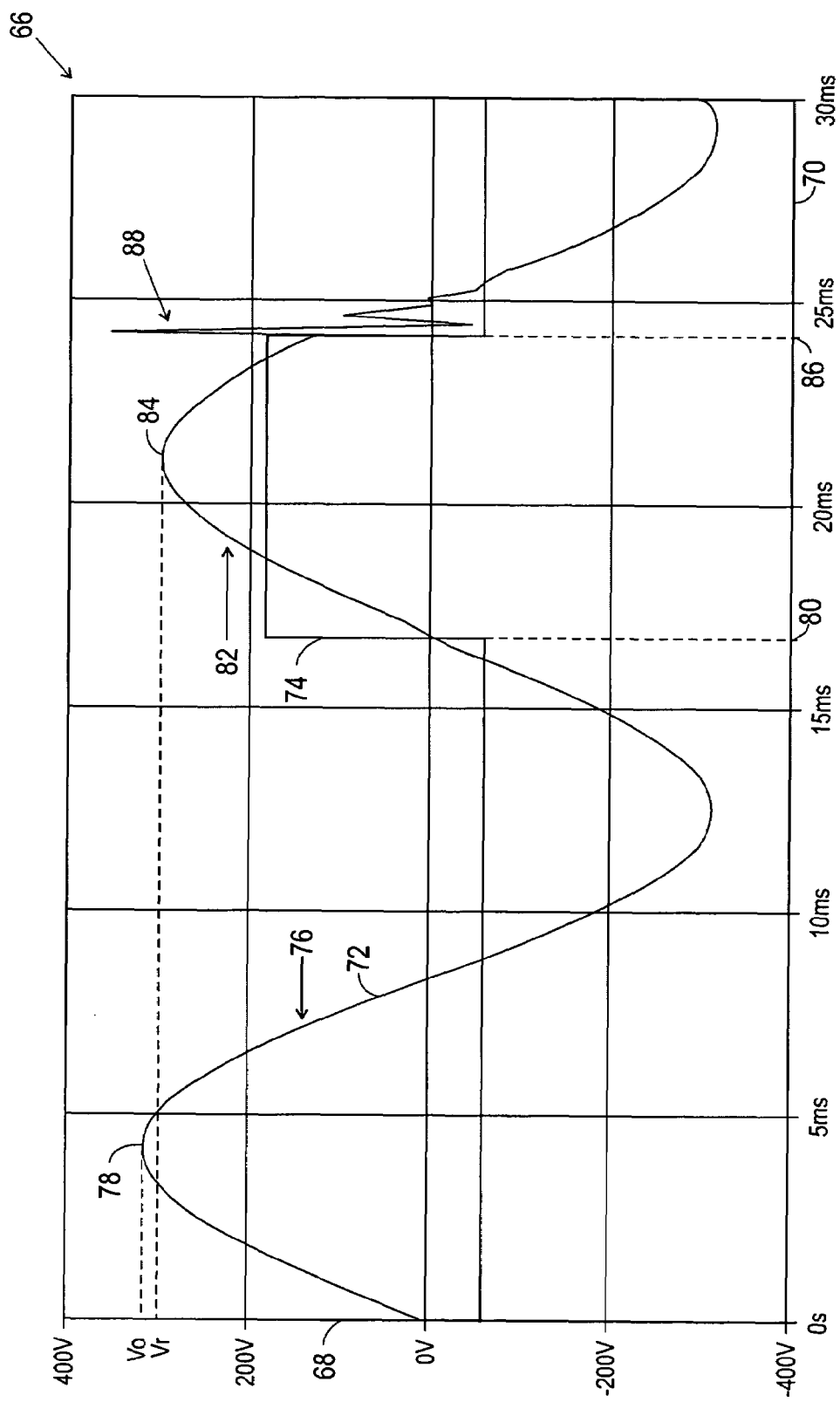
FIG. 4 is a voltage waveform and switching waveform for a solid state switch of the circuitry illustrated in FIG. 2 for causing a voltage droop and a resonant ring used to identify impedance parameters.

FIG. 4 illustrates an exemplary ac voltage waveform and a switching waveform for the switch 38 during an exemplary test sequence in accordance with FIG. 3 to measure values for use in calculating the impedance parameters in accordance with Equations 3 and 6 discussed above. FIG. 4 illustrates the waveforms graphically as indicated generally by reference numeral 56. The voltage waveform is illustrated graphically with respect to voltage, as indicated axis 68 over time, as indicated by axis 70. The voltage trace 72 of the waveform takes the form of a sine wave. Trace 74 represents the state of switch 38 or, more particularly, the signal applied to drive the gate of the switch to change its conductive state during the testing procedure.

As can be seen from FIG. 4, once sampling of the waveform has begun, samples will be taken continuously at a desired frequency, above the Nyquist rate, to provide reliable data for analysis. In a first cycle 76 of the waveform, with the test circuit open, a peak voltage 78, corresponding to Vo will be detected, among the other values detected and stored. At some point during or preceding a second cycle 82, switch 38 is placed in a conductive state to complete the current carrying path between the line conductors. The change in state of the switch is indicated at the rising edge 74 of the waveform, and occurs at time 80. As a result of the significant voltage drain caused by resistor 34, a sag or droop is detected in the peak 84 of the voltage waveform, with the peak generally corresponding to the value Vr. Subsequently, the switch 38 is opened, as indicated by the drop in waveform 74 that occurs at time 86 indicated in FIG. 4. The opening of switch 38 causes a resonant ring as indicated generally at reference numeral 88. As noted above, the resonant ring may have a peak voltage above the peak voltage of the sinusoidal waveform, and the switch 38 may be selected to accommodate such peaks.

Figure 5:
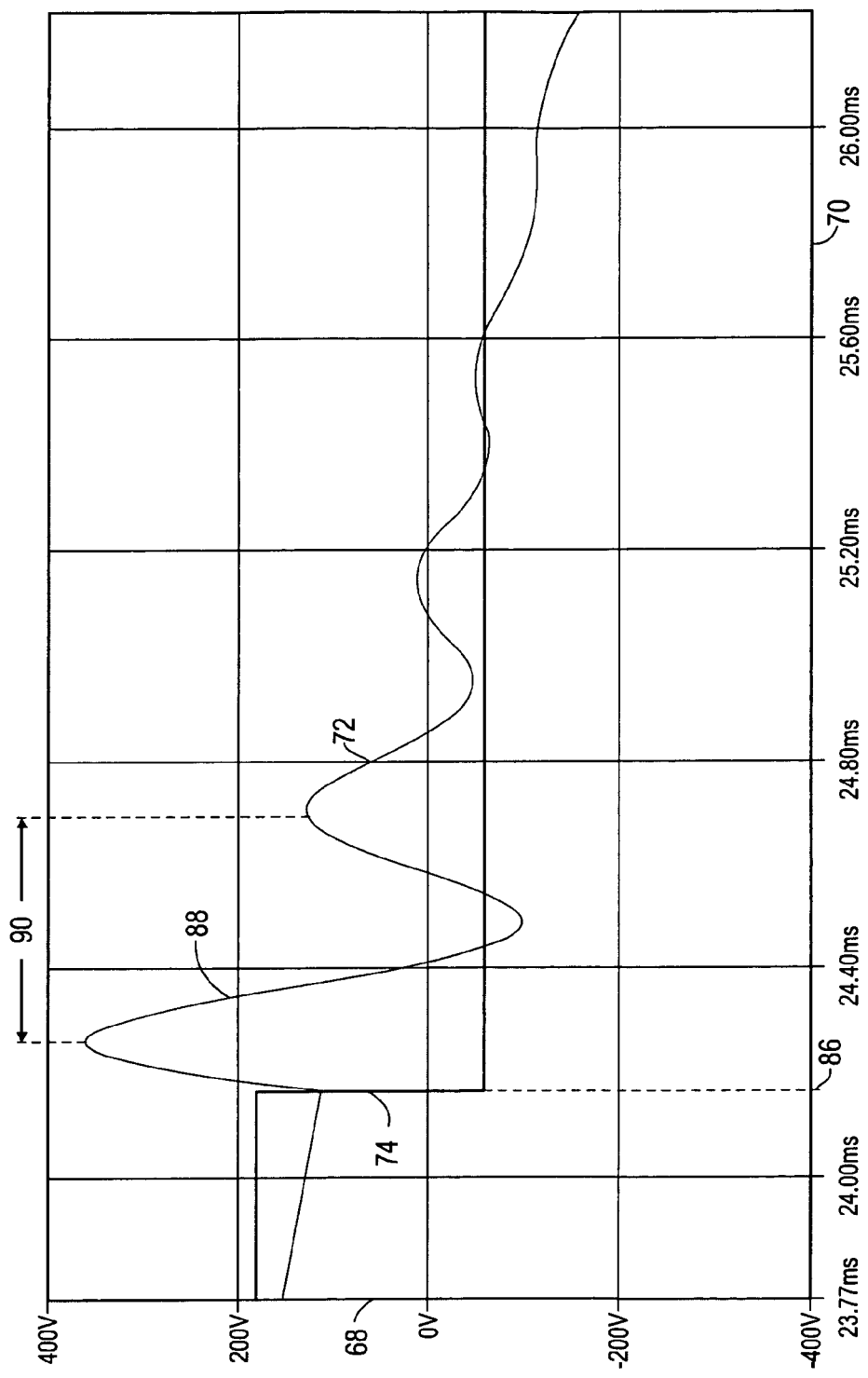
FIG. 5 is a detailed view of an exemplary resonant ring caused in a voltage waveform and used for determine certain of the impedance parameters in accordance with aspects of the present technique.

FIG. 5 illustrates a more detailed view of the resonant ring occurring from opening of the switch of the line test circuitry. Again graphed with respect to a voltage axis 68 and a time axis 70, the ring occurs as the voltage across the lines is decreasing, as indicated by the initial slope of trace 72. The falling edge of waveform 74 represents the removal of the drive signal to the switch causing opening of the circuit. The resulting resonant ring 88 will have a period, or consequently a frequency, that is a function of the circuit component parameters and of the inductive component of the line impedance. Because the voltage waveform is continuously sampled, the frequency or period may be measured, with a full period being indicated by reference numeral 90 in FIG. 5. As will be apparent to those skilled in the art, the period may be measured in a number of ways, as may the frequency. For example, a half cycle alone may be used to determine the frequency or period, or a full or even more than one cycle may be used. Similarly, in a present embodiment, the values of the ring as sampled by the circuitry may be compared or processed with the naturally declining value of the sinusoidal waveform to provide an accurate indication of the period of the resonant ring. Based upon the measured voltages, Vo, Vr and either the period of the resonant ring or its frequency, then, Equations 3 and 6 may be employed or determining the values of L and R.

Figure 6:
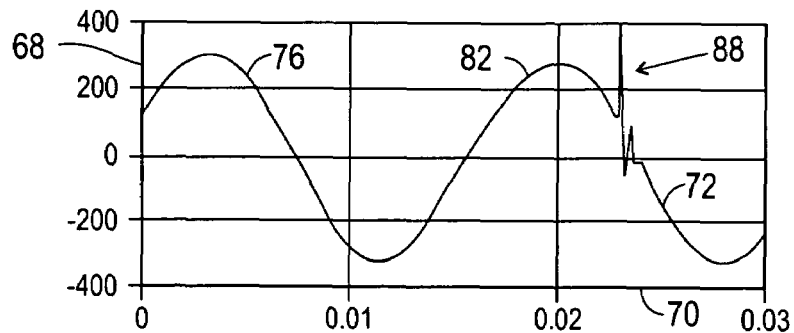
FIG. 6 is graphical representation of a voltage waveform similar to that of FIG. 4, before exemplary filtering of sampled data.
Figure 7:
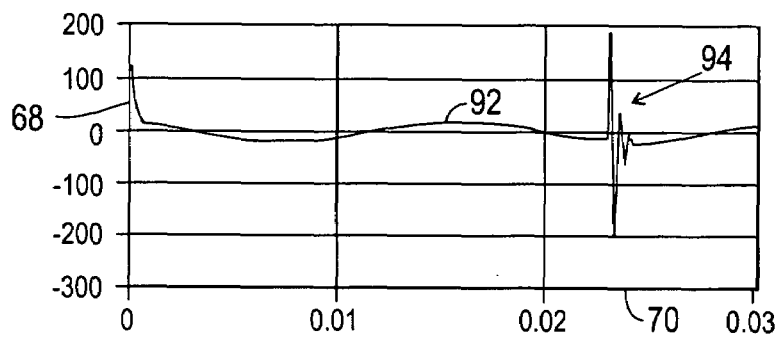
FIG. 7 is a graphical representation of the waveform of FIG. 6 following high pass filtering of sampled data to flatten a portion of the waveform around a resonant ring.
Figure 8:
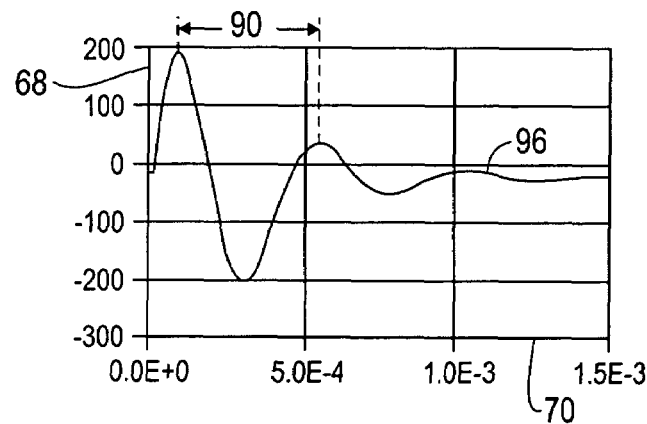
FIG. 8 is a more detailed illustration of the resonant ring visible in FIG. 7 from which measurements can be made for computing impedance parameters.
Figure 9:
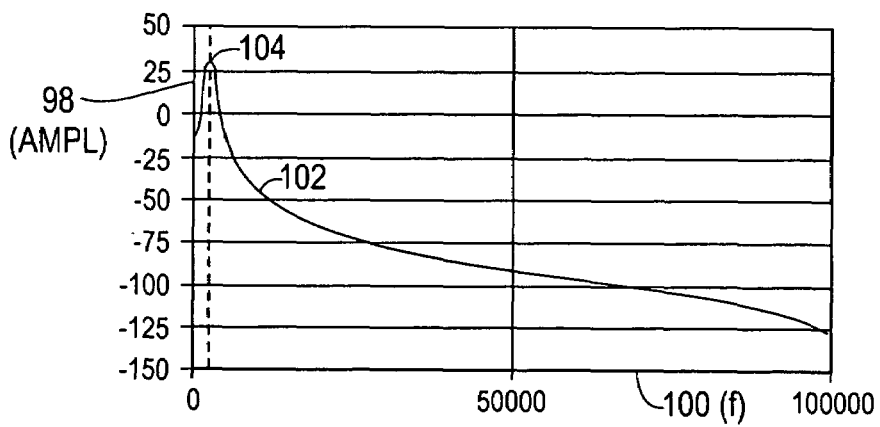
FIG. 9 is a graphical representation of an exemplary frequency domain plot of the ring illustrated in FIG. 8.

An alternative approach to identifying the parameters discussed above is illustrated in FIGS. 6-9. As illustrated in FIG. 6, the voltage waveform that is sampled by the voltage measurement circuitry may be illustrated as having successive cycles 76 and 82, with a voltage droop or sag occurring in cycle 82 due to the resistor 34 discussed above. The subsequent ring upon a removal of the short circuit across the power lines is again indicated at reference numeral 88. The data may be high-pass filtered to generally flatten the waveform as indicated at reference numeral 92 in FIG. 7. The high-pass filtered waveform will then exhibit the ring which may be timed to occur during a generally linear portion of the sine wave, as indicated at reference numeral 94 in FIG. 7. From the data, the ring 94 may be extracted as indicated generally in FIG. 8. The period, or half period, or frequency of the ring may then be determined, as indicated at reference numeral 90 in FIG. 8. Finally, where desired, the waveform may be converted by a one-dimensional fast Fourier transform to a frequency response relationship as indicated in FIG. 9. This frequency response may be represented graphically along an amplitude axis 98 and a frequency axis 100. The frequency trace 102 in FIG. 9 indicates a resonant frequency at peak 104 which generally corresponds to the wavelength measured for the resonant ring as discussed above. As noted, either the frequency or the period of the waveform may be used for the calculation of the impedance parameters.

Figure 10:
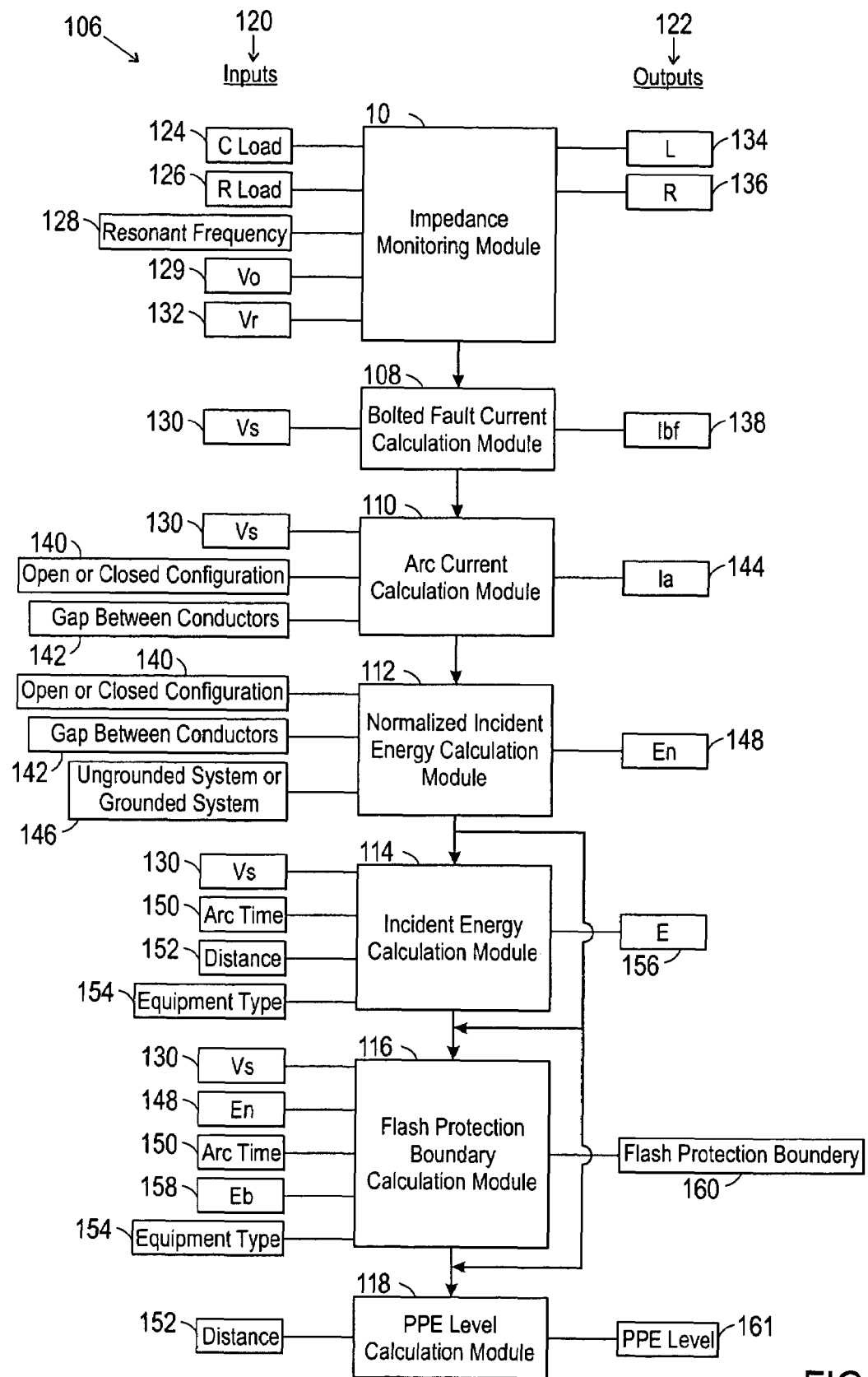
FIG. 10 is a diagrammatical representation of an incident energy measurement system in accordance with aspects of the present technique.

FIG. 10 is a diagrammatical representation of an incident energy measurement system 106 in accordance with aspects of the present technique. The incident energy measurement system 106 comprises modules represented by blocks 10, 108, 110, 112, 114, 116, and 118. The modules (blocks 10 and 108-118) may be hardware, software, firmware, or some combination of hardware, software, and firmware. Additionally, an individual module does not necessarily solely comprise each illustrated module function. The modules shown in the blocks 10 and 108-118 are merely one example and other examples can be envisaged wherein the functions are distributed differently or where some modules are included and other modules are not included. Further, FIG. 10 also illustrates inputs 120 and outputs 122 from each of the modules 10 and 108-118. Those of ordinary skill in the art will appreciate that the inputs 120 and the outputs 122 are exemplary. In alternate embodiments, the inputs 120 and the outputs 122 to each of the modules 10 and 108-118 may differ. Similarly, while FIG. 10 call for certain "inputs," in many installations, the values used in the various determinations will be known in advance, may be pre-programmed in the modules, or may be provided in a menu for user selection. Lastly, while the incident energy measurement system 106 is described herein in regard to a three phase system, those of ordinary skill in the art will appreciate that the techniques herein may be applied to single phase or dual phase systems.

As described above, the impedance monitoring module 10 (previously referred to as the impedance monitoring system 10) may receive or calculate a Cload value 124 (e.g., the value of the capacitor 36, described above), and an Rload value 126 (e.g., the rating of the resistor 34, described above), a resonant ring frequency f 128, a voltage Vo 129 (the voltage sampled across the power line with the line test circuitry opened), and a voltage Vr 132 (a voltage across the power line with the circuitry closed) for each phase of a three phase power transmission system. From these inputs, as described in relation to Equations 1-6 above, the impedance monitoring module 10 may compute an inductive component of the line impedance (L) 134 and a resistive component of the line impedance (R) 136. As illustrated in FIG. 10, the inductive component 134 and the resistive component 136 may be either communicated by the system 106 as outputs, transmitted to the bolted fault current calculation module 108, or both The bolted fault current calculation module 108 may calculate a bolted fault current (Ibf) 138 using Ohm's law for AC circuits, which is:

$$Ibf = \frac{V}{Z} \qquad \text{Equation 7}$$

where Ibf is the bolted fault current 138, V is the three phase system voltage Vs 130 calculated based on the voltage Vo 129 for each of the three phases, and Z is a line impedance calculated from the inductive component 134 and the resistive component 136 for each of the three phases. As illustrated in FIG. 10, the bolted fault current 138 may either be communicated by the system 106, transmitted to the arc current calculation module 110, or both The arc current calculation module 110 calculates an arc current Ia 144. In one embodiment, the arc current calculation module 110 calculates the arc current Ia 144 based on the equations set forth in the Institute for Electrical and Electronics Engineers ("IEEE") Guide for Performing Arc-Flash Hazard Calculations, IEEE Std. 1584 (2002), which is hereby incorporated by reference. Specifically, if the voltage Vo is less than 1000 volts, the arc current 144 may be calculated as follows:

$$\log(Ia) = K1 + 0.662 \log(Ibf) + 0.966V + 0.000526G + 0.5588V(\log(Ibf) - 0.00304G(\log(Ibf)) \qquad \text{Equation 8}$$

where the arc current 144 equals $10^{\log(Ia)}$; K1 equals −0.153 for open configurations (i.e., configurations where the conductors that may arc are not contained within a chassis or enclosure) and −0.097 for enclosed configurations; V is the voltage Vs 130 in kilovolts (KV), G is a gap 142 between the conductors that could potential arc in millimeters (mm); and Ibf is the bolted fault current 138 in kiloamps (KA). If the voltage V is greater than 1000 volts, the following equation is used instead of Equation 8:

$$\log(Ia) = 0.00402 + 0.983 \log(Ibf). \qquad \text{Equation 9}$$

Those of ordinary skill in the art will appreciate that Equations 8 and 9 are derived empirically using statistical analysis and curve fitting programs. As such, they are only applicable for voltages Vs 130 in the range of 208V-15,000V, power line frequencies of either 50 Hz or 60 Hz, bolted fault currents 138 in the range of 700A-106,000A, and for gaps between conductors 142 of 13 mm to 152 mm. In embodiments incorporating parameters outside these ranges, the theoretically-derived Lee's method can be used in place of the modules 110 and 112, as will described further below.

Once calculated, the arc current 144 may either be communicated by the system 106, transmitted to the normalized incident energy calculation module 112, or both. In one embodiment, the normalized incident energy calculation module 112 calculates a normalized incident energy 148 using the following equation:

$$\log(En) = K2 + K3 + 1.081 \log(Ia) + 0.0011G \qquad \text{Equation 10}$$

where $10^{\log(En)}$ is the normalized incident energy 148 in joules per square centimeter (J/cm$^2$); K2 is −0.792 for open configurations and −0.555 for enclosed configurations; K3 is zero for ungrounded or high-resistance grounded systems and −0.113 for grounded systems; Ia is the arc current 144; and G is the gap 142. Equation 10 calculates the incident energy normalized for an arc time t of 0.2 seconds and a distance from the possible arc point (e.g., the MCC) to a measurement point of 610 mm. One of ordinary skill in the art will appreciate that in alternate embodiments, the normalized incident energy calculation module 112 may employ an alternate version of Equation 10 that has been normalized for a different arc time t or a different distance D. Further, as described above, for embodiments where one of the parameters Vo, f, Ibf, or G falls outside of the empirically tested range (see above), the normalized incident energy calculation module 112 may be absent from incident energy measurement system 106.

Once calculated, the normalized incident energy 148 may either be communicated by the system 106, transmitted to the incident energy calculation module 114, or both. Unlike the normalized incident energy calculation module 112 which is normalized for a distance of 610 nm, the incident energy calculation module 114 is configured to calculate an incident energy 156 in J/cm$^2$ at an arbitrary distance D 152 from the point of the potential arc. For example, the incident energy calculation module 114 can calculate the incident energy 156 at one meter from an MCC or three meters, and so forth. In one embodiment, the incident energy calculation module 114 calculates the incident energy 156 with the following equation:

$$E = 4.184(Cf)(En)\left(\frac{t}{0.2}\right)\left(\frac{610^x}{D^x}\right)$$ Equation 11 where E is the incident energy 148; Cf is 1.0 if the voltage Vs 130 is greater than 1000 volts and 1.5 if the voltage Vs 130 is equal to or less than 1000 volts; En is the normalized incident energy 148; t is an arc time 150, which is described in greater detail below; D is the distance 152; and x is a distance exponent, which is also described in greater detail below.

As noted above, one of the elements in Equation 11 is the arc time 150. The arc time 150 is a factor in calculating the incident energy 156, because the amount of energy generated by the arc flash is proportional to the length of time that the arc current 144 is actually flowing (i.e., the device is arcing). Those of ordinary skill in the art will appreciate that in most situations devices such as circuit breakers or fuses will detect the sudden increase in current that accompanies an arc flash and interrupt power to the system. Unfortunately, these devices are not instantaneous, and the arc current 144 will flow for approximately as long as it takes the devices to activate and interrupt the power. Equation 10 above (the normalized incident energy calculation) is normalized for an arc time of 0.2 seconds (i.e., the arc current 144 flows for 0.2 seconds). However, the arc time 150 for a particular system may not be 0.2 seconds. As such, one of the inputs to the incident energy calculation module 114 may be the arc time 150 for the system of interest.

Those of ordinary skill in the art will appreciate that there are several techniques for determining the arc time 150. For example, the manufacturer of an electrical system, such as a circuit breaker, a fuse, or a circuit interrupter, may provide the arc time 150 for the electrical system. Also, IEEE Std. 1584 provides versions of Equation 11 pre-calculated with the arc times 150 for a variety of standard types of fuses or circuit breakers. Further, the arc time 150 may also be determined by charting the time/current characteristics for the circuit breaker or fuse that will sever the electrical connection and stop the flow of the arc current 144.

As described above, Equation 11 also employs the distance exponent x. The distance exponent x may be determined using a look-up table, such as Table 1 (below) from IEEE Std.1584 where an equipment type 154 (open air, switchgear, MCC and panels, or cable) is entered in the incident energy calculation module 114 as an input.

TABLE 1

| Vs | Equipment Type | Distance Exponent x |
|---|---|---|
| 208 V-1000 V | Open Air | 2.0 |
| | Switchgear | 1.473 |
| | MCC and panels | 1.641 |
| | Cable | 2.0 |
| 1000 V-5000 V | Open Air | 2.0 |
| | Switchgear | 0.973 |
| | Cable | 2.0 |
| 5000 V-15,000 V | Open Air | 2.0 |
| | Switchgear | 0.973 |
| | Cable | 2.0 |

In one embodiment, the incident energy calculation module 114 is programmed with a look-up table (LUT) comprising Table 1.

In an alternate embodiment of the incident energy measurement system 106, the incident energy calculation module 114 calculates the incident energy using Lee's method. As stated earlier, Lee's method is theoretical and, thus, can be used to calculate the incident energy 156 outside the empirical range of Equations 8-11; (i.e., Vs greater than 15,000V, arc fault currents greater than 106,000 A, gaps between conductors larger than 152 mm, and so forth). As Lee's method is based on the arc fault current 138, the modules 112 and 114 may be omitted from an embodiment of the incident energy measurement system 106 that employs Lee's method. The incident energy calculation module 114 can use the following equation to calculate the incident energy 156 using Lee's method:

$$E = 2.142 * 10^6 (V)(Ibf)\left(\frac{t}{D^2}\right)$$ Equation 12 where E is the incident energy 156 measured in J/cm²; V is the voltage Vs 130; t is the arc time 150 in seconds; D is the distance 152; and Ibf is the arc fault current 138. Once the incident energy calculation module 114 has calculated the incident energy 156 at the distance 152 this value may be reported by the incident energy measurement system 106.

As illustrated in FIG. 10, the incident energy measurement system 106 may also comprise the flash protection boundary calculation module 116. The flash boundary calculation module 116 may operate in conjunction with or in alternative to the incident energy calculation module 114. As its title suggests, the flash protection boundary calculation module 116 calculates a flash protection boundary 160 for the system being measured (e.g., for an MCC). Those of ordinary skill in the art will appreciate that the incident energy decreases proportionally as the distance from the arcing point increases. At some distance from the origination point of the arc, the incident energy is low enough to be considered acceptable. This distance is known as the flash protection boundary 160. In one embodiment, the flash protection boundary 160 is deemed to exist at a distance from the arcing point where an incident energy Eb 158 is equal to 5.0 J/cm².

The flash protection boundary calculation module 116 is similar to the incident energy calculation module 114 except that rather than determining the incident energy 156 at the distance 152, the flash protection boundary calculation module 116 determines the flash protection boundary (i.e., a distance) where the incident energy 156 will be at the incident energy level Eb 158. In one embodiment, the flash protection boundary calculation module 116 employs the following equation:

$$Db = 4.184(Cf)(En)\left(\frac{t}{0.2}\right)\left(\frac{610^x}{Eb^x}\right)^{\frac{1}{x}}$$ Equation 13 where Db is the flash protection boundary 160 in millimeters; Cf is 1.0 if the voltage Vs 130 is above 1000 volts and 1.5 if the voltage Vs 130 is equal to or less than 1000 volts; t is the arc time 150; Eb is the incident energy 158 at the flash protection boundary 160 (e.g., 5.0 J/cm²); and x is the distance exponent, as described above. Once calculated, the flash protection boundary 160 can be reported by the incident energy measurement system 106.

The flash protection boundary 160 can also be determined using Lee's method. Specifically, the flash protection boundary calculation module 116 may employ the following equation:

$$Db = \sqrt{2.142*10^6(V)(Ibf)\left(\frac{t}{Eb^2}\right)} \quad \text{Equation 14}$$

where Db is the flash protection boundary 160; V is the voltage Vs 130; Ibf is the arc fault current 138; t is the arc time 150; and Eb is the incident energy 158.

Alternatively or in conjunction with the incident energy calculation module 114 and the flash protection boundary calculation module 116, the incident energy measurement system 106 may also include a PPE level calculation module 118. In one embodiment, the PPE level calculation module 118 calculates the PPE level 161 at one or more distances 152 from the potential arcing point. For example, the PPE level calculation module 114 may calculate that level 1 PPE is appropriate at six meters from the potential arc point or that level 3 PPE is appropriate for work being performed on equipment in the same MMC as the potential arcing point. To determine the PPE level 161, the PPE level calculation module 118 may employ either Equation 11 or 12, as outlined above, in conjunction with the following table from NFPA 70E, which is hereby incorporated by reference:

TABLE 2

| PPE Category | Eb (in J/cm$^2$) |
|---|---|
| 0 | <5.0 |
| 1 | 5.0-16.74 |
| 2 | 16.74-33.47 |
| 3 | 33.47-104.6 |
| 4 | 104.6-167.36 |

For example, the PPE level calculation module 118 may compute an incident energy of 18.24 J/cm$^2$ at 0.1 meters using Equation 11, as described above. Because 18.24 J/cm$^2$ falls between 16.74 and 33.47, the PPE level calculation module 118 would determine that level 2 PPE is appropriate at 0.1 meters from the arc point. Once the PPE level calculation module 118 determines the PPE level 160, it may communicate this determination out of the incident energy measurement system 106 for display, as further described below. In one embodiment, Table 2 is stored in the PPE level calculation module 118 as a look-up table.

Figure 11:
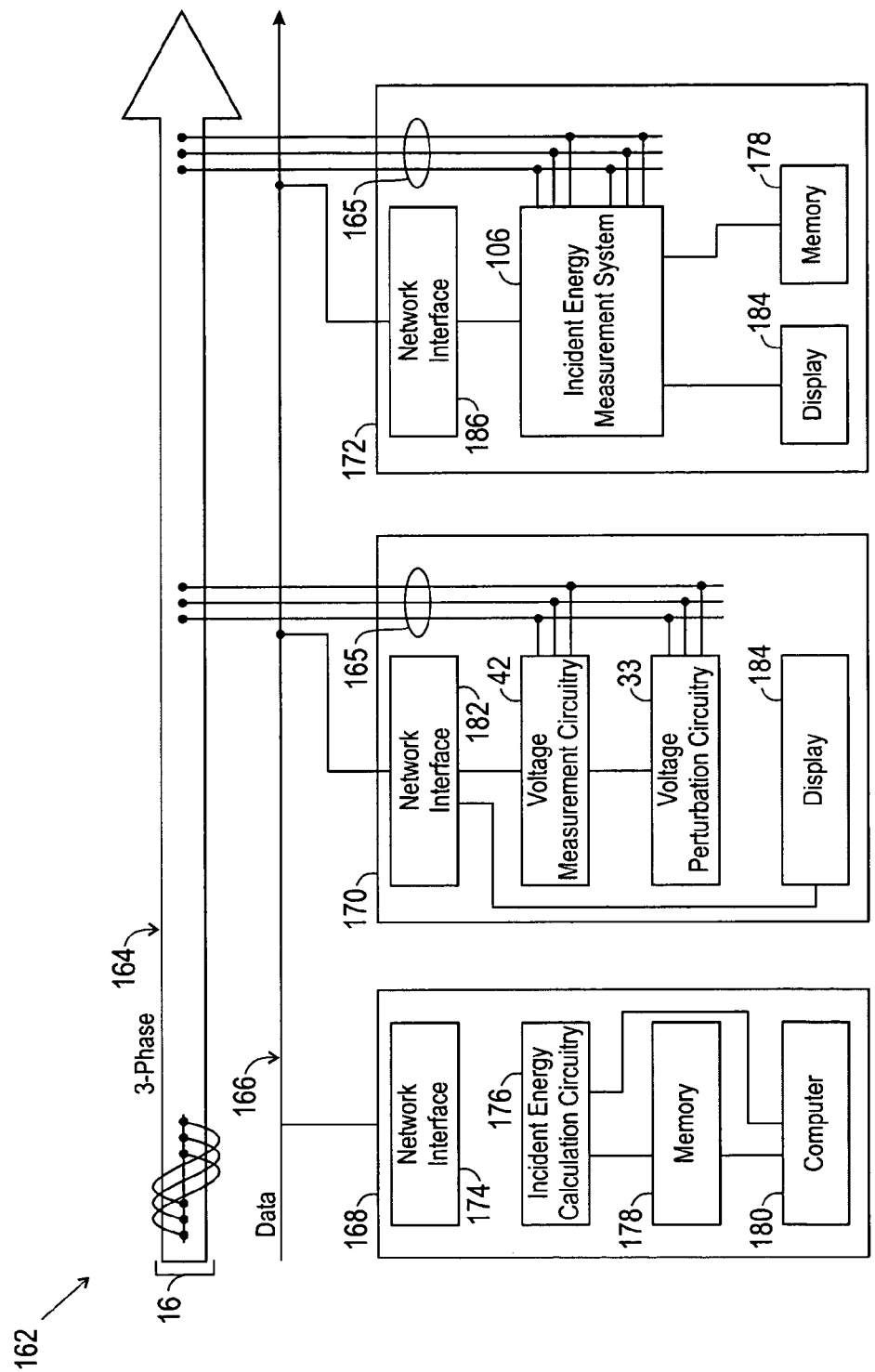
FIG. 11 is a diagrammatical representation of an exemplary system employing the incident energy measuring system.

FIG. 11 is a diagrammatical representation of an exemplary system 162 employing the incident energy measuring system 106. The system 162 comprises a three phase power bus 164 and a data bus 166. The three phase power bus may be coupled to the power supply grid 16. As illustrated, the three phase power bus 164 provides three phase power to bus bars 165 within MCCs 170 and 172. This form of power distribution is well known to those of ordinary skill in the art and need not be described in greater detail. The data bus 166 provides a communication pathway between a remote command and control unit 168 and the MCCs 170 and 172. As will be described in greater detail below, the illustrated system 162 includes two types of exemplary MCCs 170 and 172. The MCC 170 comprises a distributed incident energy monitoring system 106, while the MCC 172 comprises a stand-alone incident energy monitoring system 106. Those of ordinary skill in the art will appreciate that the MCCs 170 and 172 are exemplary. In alternate embodiments, virtually any type of electrical device or apparatus suitable for use with the incident energy monitoring system 106 may employ the incident energy monitoring system 106 in the manner described below.

The control unit 168 may comprise a network interface 174, incident energy calculation circuitry 176, memory 178, and a computer 180. The network interface 174 facilitates communication between a control center or remote monitoring station and the MCCs 170 and 172. In one embodiment, the control unit 168 communicates with the voltage measurement circuitry 42 disposed on the MCC 170 via the network interface 174. The incident energy calculation circuitry 176 comprises the data processing circuitry 44 and some or all of the modules 108-118. The incident energy calculation circuitry 176 receives the inputs 120 (see FIG. 10) from the voltage measurement circuit 42 disposed in the MCC 170 or from a memory 178, which is programmed with some or all of the inputs 120. The incident energy calculation circuitry 176 employs the inputs 120 to produce the outputs 122, as described above with regard to FIGS. 2 and 10. In one embodiment, the control unit 168 is configured to trigger the measurement of the incident energy 156 or any of the other outputs 122. In another embodiment, the outputs 122, once calculated, are transmitted to the computer 180 within the control unit 168. In still another embodiment, the computer 180 may be employed to program the memory 178 with the inputs 120.

As stated above, the MCC 170 includes a distributed version of the incident energy monitoring system 106. In this embodiment, the MCC 170 works in conjunction with the control unit 168 to determine the outputs 122, as described above. As such, the MCC 170 comprises only a portion of the incident energy monitoring system 106—namely, the voltage measurement circuitry 42 and the voltage perturbation circuitry 33. The voltage perturbation circuitry 33 and the voltage measurement circuitry function as described above in regard to FIG. 2 except that the voltage perturbation circuitry 33 and the voltage measurement circuitry communicate with the data processing circuitry 44 within the incident energy calculation circuitry 176 via a network interface 182 and the data bus 166. In other words, circuitry within the MCC 170 is configured generate the resonant ring 88 (see FIG. 4), to measure the resonant ring 88, and to communicate the measurements to the incident energy calculation circuitry 176, which determines the outputs 122. In one embodiment, the control unit 168 may transmit a portion of the outputs 122 back to the MCC 170 for display on a display 184, as will be described further below in regard to FIG. 12. Those skilled in the art will appreciate that in alternate embodiments, the system 162 may comprise multiple MCCs 170 each of which is supported by a single control unit 168. Further, in still other embodiments, some of the modules 108-118 may be located in the MCC 170 instead of the control unit 168. Moreover, in yet other embodiments, the MCC 170 may be configured to process the voltage measurements from the voltage measurement circuitry prior to communicating with the data processing circuitry 44.

Turning next to the stand-alone MCC 172, the MCC 172 comprises the incident energy monitoring system 106. As illustrated, the incident energy measurement system 106 is coupled to the three phase power bus 166 via the bus bars 165. As such, the impedance monitoring module 10 within the incident energy monitoring system 106 can function as described above in regard to FIGS. 1-10. The MCC 172 also comprises the memory 178, which can provide the inputs 120 to the incident energy measurement system 106. The memory 178 may either be programmed by a computer coupled directly to the MCC 172 (not shown) or by the computer 180 in the control unit 168 via the data bus 166 and a network interface 186. The incident energy monitoring system 106 within the MCC 172 may be configured to display one or more of the outputs 122 on the display 184, as described further below. In addition, in one embodiment, the MCC 172 is configured to transmit one or more of the outputs 122 to the control unit 168 via the data bus 166.

Those skilled in the art will appreciate that the data bus 166 and the network interfaces 174, 182, and 186 may employ a wide variety of suitable communication technologies or protocols. For example, in one embodiment, the data bus 166 may comprise a local area network, and the network interfaces 174, 182, and 186 may comprise network interface cards. In yet another example, the data bus 166 may comprise a wireless network based on the IEEE 802.11 standard or another suitable wireless communication protocol, and the network interfaces 174, 182, and 186 may comprise wireless transmitters and receivers.

Figure 12:
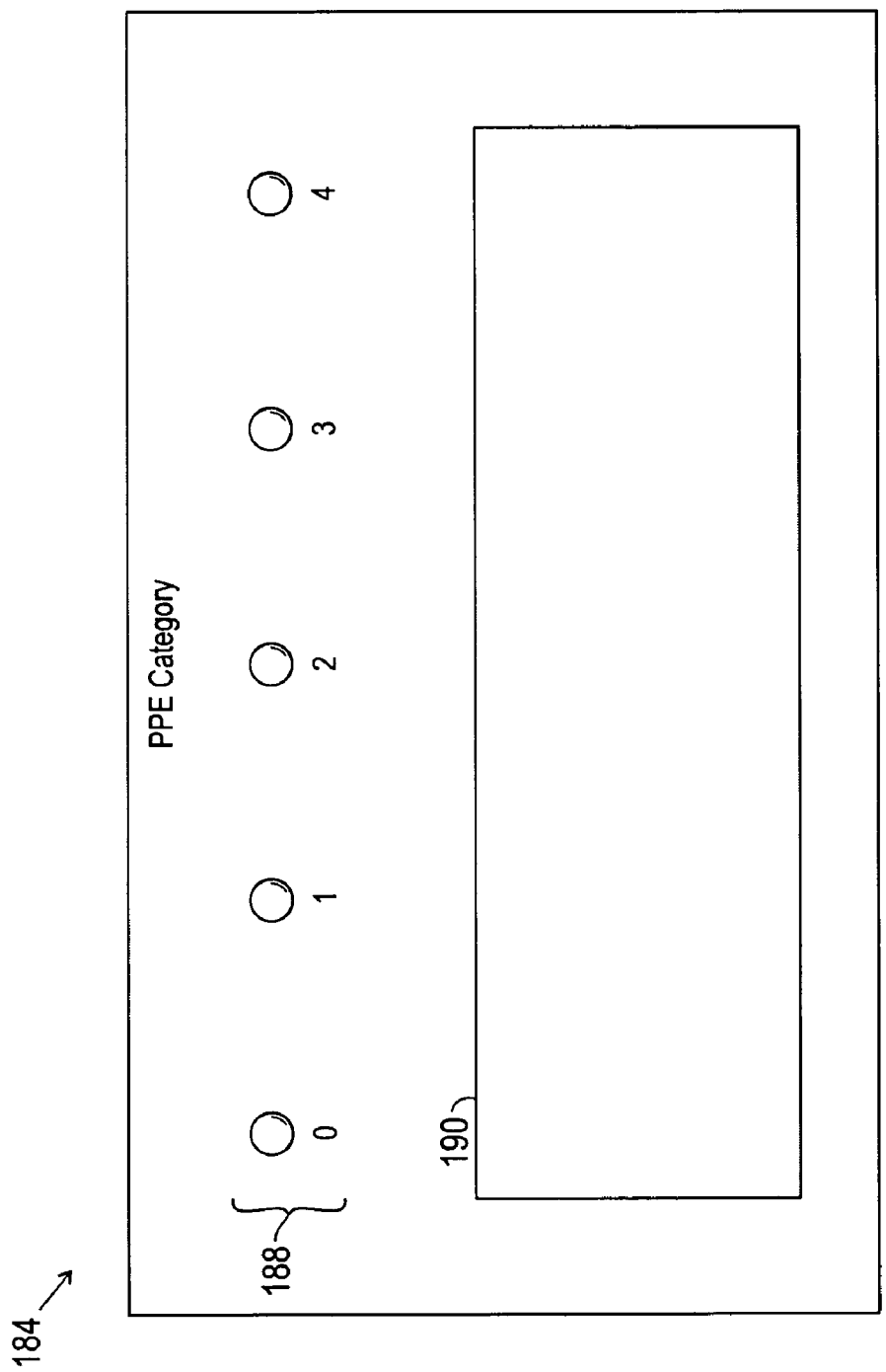
FIG. 12 is a graphical representation of an exemplary display of PPE levels based upon determinations made via the systems of preceding figures.

FIG. 12 is a graphical representation of an exemplary display 184 of PPE levels based upon determinations made via the systems of preceding figures. Both the MCC 170 and the MCC 172 may include the display 184 to display one or more of the outputs 122 to a user or operator. The illustrated display 184 comprises a set of PPE level indicator lights 188. In one embodiment, the display 184 may be mounted in a front panel of the MMC 170 or 172. The PPE level indicator lights 188 may be configured to display the level of PPE appropriate for performing maintenance on the MMC 170 or 172. Specifically, a particular light corresponding to the PPE level may be illuminated. In an alternate embodiment, a light tower or siren-style light mounted to the MCC 170 or 172 may produce colored light indicative of the PPE level. The display 184 may also comprise a screen 190. In one embodiment, the screen 190 comprises a liquid crystal diode (LCD) display or other form of textual or graphical display. The screen 190 is configurable to display any of the outputs 122. For example, the screen 190 may be configured to display the flash protection boundary 160 or the normalized incident energy 148. As will be appreciated by those skilled in the art, the determination of the PPE level, and its display at or near the point of entry for maintenance can greatly facilitate the task of donning the correct PPE prior to servicing of the equipment.

Figure 13:
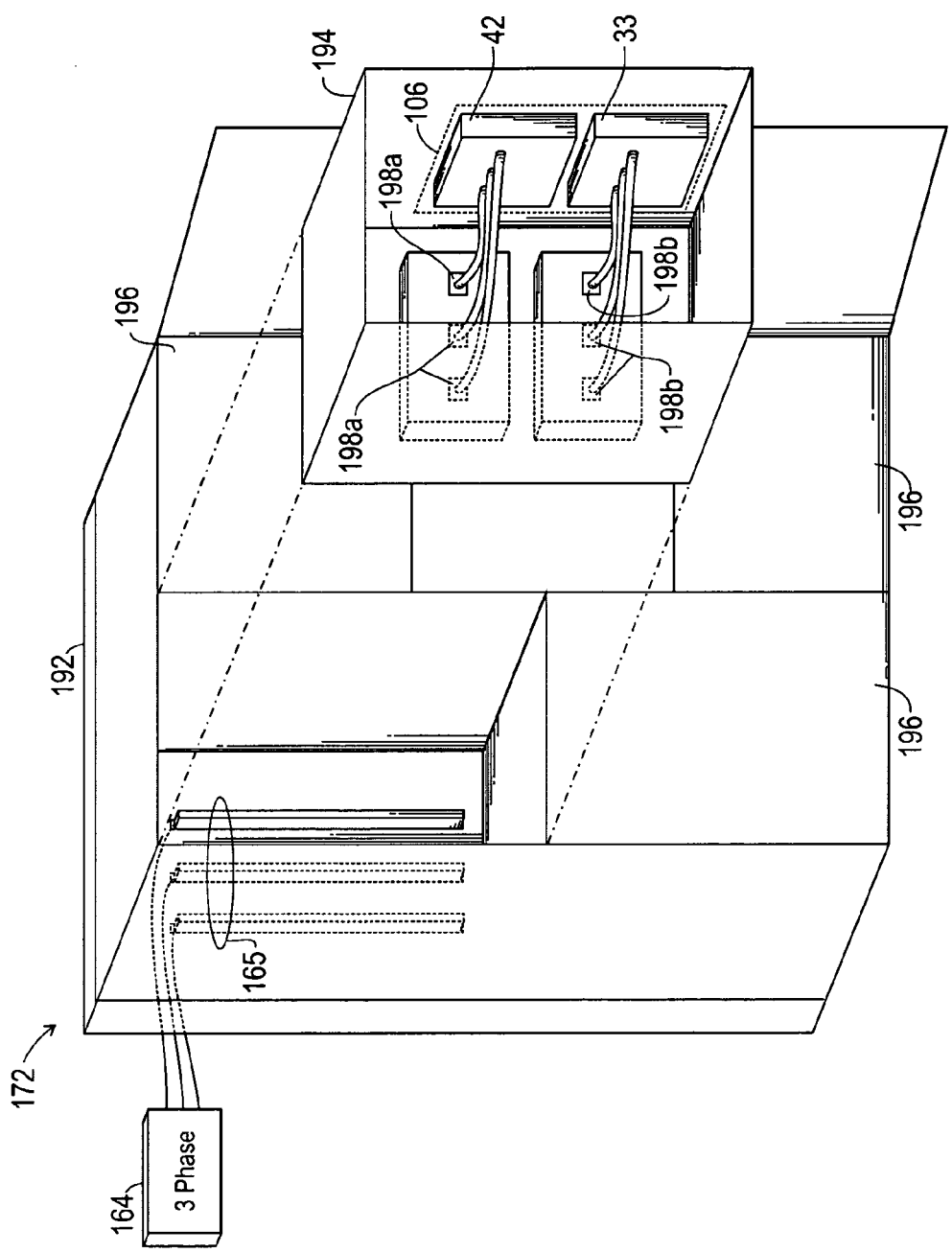
FIG. 13 is a diagrammatical representation of an exemplary MCC incorporating aspects of the present techniques.

FIG. 13 is a diagrammatical representation of an exemplary MCC 172 incorporating aspects of the present techniques. The MCC 172 comprises a chassis 192, an incident energy measurement bucket 194, and a plurality of motor control buckets 196. As described above, the MCC 172 comprises the bus bars 165, which are coupled to the three phase power bus 164. While not illustrated in FIG. 13, the data bus 166 may also be connected to the MCC 172. Similarly, as will be appreciated by those skilled in the art, in practice, the bus bars 165 may be disposed behind one or more plates or barrier The incident energy measurement bucket 194 comprises the incident energy measurement system 106. Those of ordinary skill in the art will appreciate that there is an intrinsic resistance in the connection between the voltage perturbation circuit 33 and the bus bars 165. This intrinsic resistance can affect the accuracy of the measurements of the voltage measurement circuitry 42. To reduce the effects of this intrinsic resistance, the voltage measurement circuitry 42 may be coupled to a first set of stabs 198a and the voltage perturbation circuitry 33 may be coupled to a second, separate set of stabs 198b. Those of ordinary skill in the art will appreciate that coupling the voltage measurement circuitry 42 to a different set of stabs than the voltage perturbation circuitry 33 increases the accuracy of the measurement of the voltage measurement circuit 42. That is, due to the significant current draw of the voltage perturbation circuitry 33, voltages that would be measured at that circuit could be significantly affected by the resistance of that circuit's stabs, fuses, and so forth. On the other hand, the current draw of the voltage measurement circuitry 42 is negligible. The parallel connection of the two circuits, then, allows for more accurate measurements of the voltages during tests.

Figure 14:
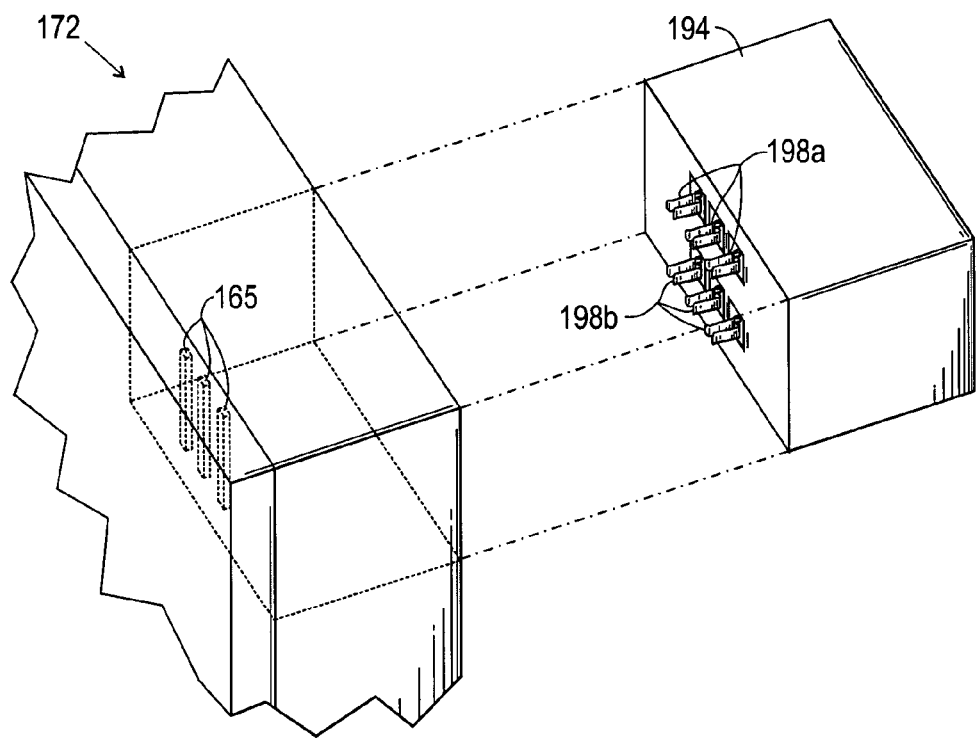
FIG. 14 is a somewhat more detailed view of the exemplary MCC of FIG. 13.

FIG. 14 is a somewhat more detailed view of the exemplary MCC 172. For simplicity, like reference numerals have been used to designate features previously described in reference to FIG. 13. In the embodiment illustrated in FIG. 14, the first set of stabs 198a are configured to be coupled to the bus bars 165 at a location above (i.e., electrically closer to the three phase power bus 164). While not illustrated in FIGS. 13 or 14, the incident energy measurement bucket may also comprise the display 184, the memory 178, and the network interface 186, as illustrated in FIG. 11.

Figure 15:
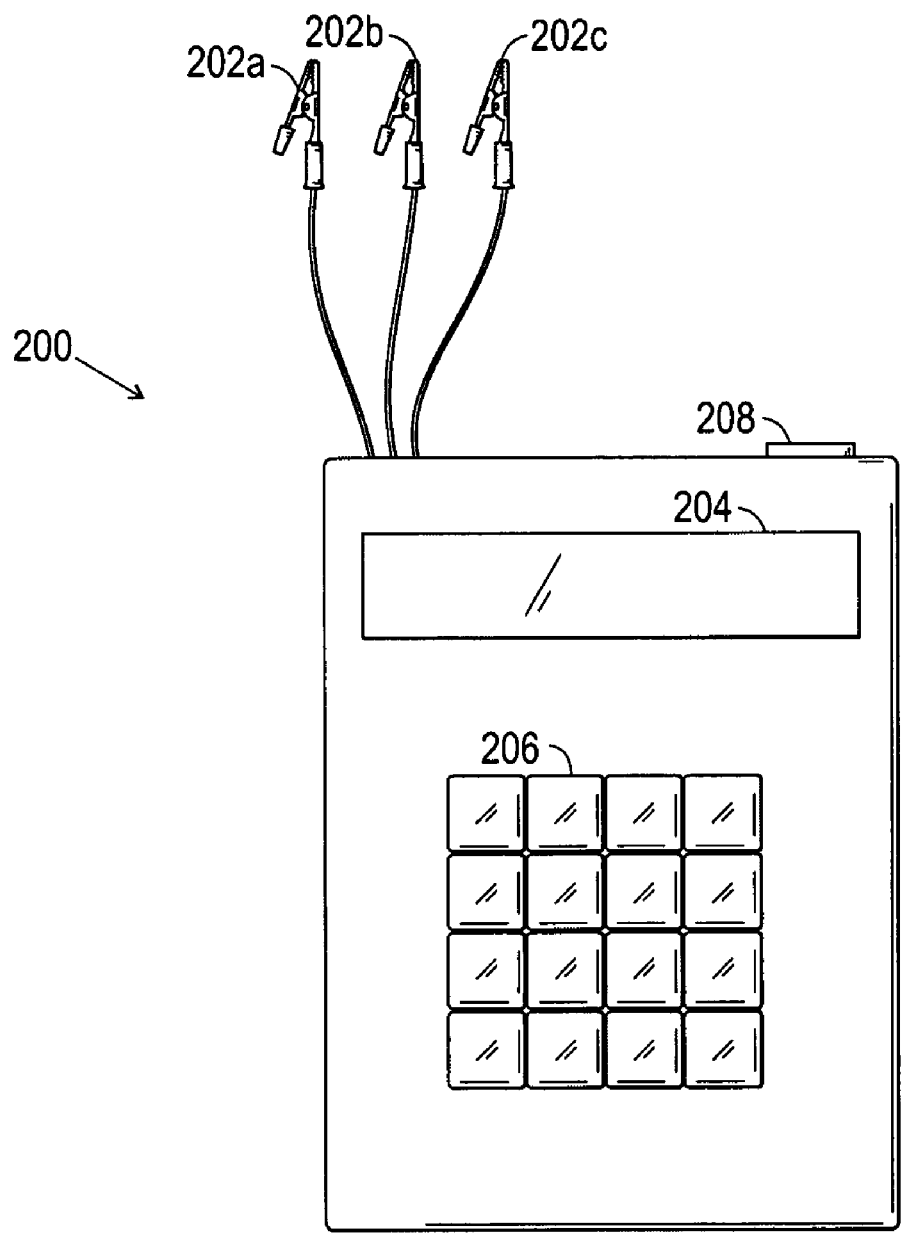
FIG. 15 is a graphical representation of an exemplary portable incident energy measurement device, again incorporating aspects of the present techniques.

FIG. 15 is a graphical representation of an exemplary portable incident energy measurement device 200, again incorporating aspects of the present techniques. In one embodiment, the portable device 200 comprises a laptop, tablet, or a portable computer system. In another embodiment, the portable device 200 comprises a personal digital assistant or palm-top computer system. The portable device 200 comprises the incident energy measurement system 106 (not shown) and a plurality of test leads 202a, 202b, and 202c. The test leads 202a-c are configured to be connected to a power source, such as the three phase power bus 164. In the illustrated embodiment, the test leads 202a-c comprise clips to connect the test leads to the three phase power bus 164. In alternate embodiments, the test leads 202a-c may comprise any form of connector suitable for connecting the test leads 202a-c to a power source.

In the embodiment illustrated in FIG. 15, each of the test leads 202a-c are coupled to both the voltage perturbation circuitry 33 and the voltage measurement circuitry 42, described above. In alternate embodiments, the portable device may comprise an additional set of test leads 202a-c that are connected to the voltage measurement circuitry 42 to increase the accuracy of the portable device 200, as described above in regard to FIGS. 13 and 14. The portable device 200 may also contain a power source, such as a battery or an ac plug (not shown).

The portable device may also comprise a display 204 and an input device 206. In one embodiment, the display 204 is a liquid crystal diode (LCD) display. The input device 206 may be an internal keyboard, an external keyboard, or a touch screen. In one embodiment, the display 204 and the input device 206 comprise a single touch screen. The portable device 200 may also comprise a communication interface 208 for connecting the portable device 200 to a computer system. The communication interface 208 may employ any communication protocol suitable for communication between the portable device 200 and the computer. For example, the communication interface 208 may comprise a USB port, a Firewire port, an Ethernet port, a Bluetooth transmitter and receiver, an 802.11 transmitter and receiver, and so forth.

In operation, the operator of the portable device 200 connects the test leads 202a-c to each of the phases of the three phase power bus 164. Because the portable device 200 is preprogrammed with the Cload value 124 and the Rload value 126, the impedance monitor module 10 (not shown) within the portable device 200 can compute the inductive component of the line impedance 134 and the resistive component of the line impedance 136 for each of the phases of the three phase power bus 164, as described above in regard to FIG. 1-9. These values (134 and 136) can then be displayed on the display 204.

In addition, the incident energy measurement system 106 within the portable device 200 can also determine the bolted fault current 138, the arc current 144, the normalized incident energy 148, the incident energy 156, the flash protection boundary 160, and/or the PPE level 161, as described above in reference to FIG. 10. In one embodiment, the inputs 120 (FIG. 10) may be entered into the device 200 via the input device 206. In another embodiment, the inputs 120 may be stored on a memory (not shown) within the portable device 200. In either case, the incident energy measurement system 106 within the portable device 200 determines one or more of the outputs 122 and then transmits the outputs 122 to the display 204.

Many of the modules described above with reference to FIG. 10 may comprise an ordered listing of executable instructions for implementing logical functions. These ordered listing can be embodied in a computer-readable medium for use by or in connection with a computer-based system that can retrieve the instructions and execute them to carry out the previously described processes. By way of example, the computer readable medium can be an electronic, a magnetic, an optical, an electromagnetic, or an infrared system, apparatus, or device. An illustrative, but non-exhaustive list of computer-readable mediums can include an electrical connection (electronic) having one or more wires, a portable computer diskette, a random access memory (RAM) a read-only memory (ROM), an erasable programmable read-only memory (EPROM or Flash memory), and a portable compact disk read-only memory (CDROM).

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method comprising:
   measuring a parameter of an ac waveform applied to an electrical line;
   computing a line impedance based upon the parameter;
   computing a bolted fault current based on the line impedance;
   measuring a first voltage of the ac waveform applied to the electrical line;
   draining current from the line and measuring a second voltage of the ac waveform during a droop in voltage resulting from the current drain; and
   removing the current drain to cause a resonant ring in the voltage in the line,
   wherein the parameter of the ac waveform is a frequency of the resonant ring.

2. The method of claim 1, comprising computing an arc current based on the bolted fault current.

3. The method of claim 2, comprising calculating a normalized incident energy based at least partially on the arc current.

4. The method of claim 3, comprising calculating an incident energy based at least partially on the normalized incident energy.

5. The method of claim 3 comprising calculating a flash protection boundary based at least partially on the normalized incident energy.

6. The method of claim 3, comprising calculating a PPE level at an arbitrary distance based at least partially on the normalized incident energy.

7. The method of claim 6, comprising displaying the PPE level.

8. The method of claim 2, comprising calculating an incident energy based on the bolted fault current.

9. A method comprising:
   generating a resonant ring in an ac waveform in an electrical line by draining current from the electrical line and removing the current drain;
   measuring a characteristic of the resonant ring;
   computing a line impedance using the characteristic of the resonant ring; and
   calculating an incident energy using the line impedance.

10. The method of claim 9, comprising calculating a level of personal protective equipment associated with the incident energy.

11. The method of claim 10, comprising providing a visual indication of the level of personal protective equipment.

12. A tangible machine readable medium comprising:
    code adapted to generate a resonant ring in an ac waveform in an electrical line by draining current from the electrical line and removing the current drain;
    code adapted to measure the frequency of the resonant ring;
    code adapted to compute a line impedance using the frequency of the resonant ring; and
    code adapted to calculate an incident energy using the line impedance.

13. A portable device comprising:
    a set of test leads; and
    an impedance monitoring module coupled to the set of test leads and configured to generate a resonant ring in an ac waveform in an electrical line by draining current from the electrical line and removing the current drain, measure a frequency of the resonant ring, and compute an impedance based on the frequency of the resonant ring.

14. The portable device of claim 13, comprising an incident energy calculation module coupled to the set of test leads and configured to calculate an incident energy based at least partially on the impedance.

15. The portable device of claim 13, comprising a display screen for displaying the impedance.

* * * * *